(12) United States Patent
Kim et al.

(10) Patent No.: US 8,523,555 B2
(45) Date of Patent: *Sep. 3, 2013

(54) APPARATUS COMPRISING SUBSTRATE AND CONDUCTIVE LAYER

(75) Inventors: Hae-sung Kim, Hwaseong-si (KR); Hyoung-soo Ko, Seoul (KR); Seung-bum Hong, Seongnam-si (KR); Jin-seung Sohn, Seoul (KR); Sung-hoon Choa, Seoul (KR); Chee-kheng Lim, Suwon-si (KR)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/621,204

(22) Filed: Sep. 15, 2012

(65) Prior Publication Data

US 2013/0064918 A1    Mar. 14, 2013

Related U.S. Application Data

(60) Continuation of application No. 13/113,534, filed on May 23, 2011, now Pat. No. 8,349,527, which is a division of application No. 11/745,609, filed on May 8, 2007, now Pat. No. 7,968,253.

(30) Foreign Application Priority Data

Jun. 20, 2006  (KR) .................. 10-2006-0055538
Dec. 11, 2006  (KR) .................. 10-2006-0125657

(51) Int. Cl.
*B29C 59/00*    (2006.01)

(52) U.S. Cl.
USPC ............................................ 425/385; 430/5

(58) Field of Classification Search
USPC ............ 425/385; 977/887; 264/293; 430/5, 430/313

See application file for complete search history.

(56) References Cited

U.S. PATENT DOCUMENTS

| | | | |
|---|---|---|---|
| 5,772,905 A | 6/1998 | Chou | |
| 7,132,225 B2 | 11/2006 | Voisin | |
| 7,140,861 B2 | 11/2006 | Watts | |
| 2006/0222968 A1 | 10/2006 | Talin | |

FOREIGN PATENT DOCUMENTS

| | | |
|---|---|---|
| JP | 5080530 A | 2/1993 |
| JP | 08102092 A | 4/1996 |
| KR | 1020050075581 A | 7/2005 |

*Primary Examiner* — Brittany Raymond

(57) ABSTRACT

A nano imprint master and a method of manufacturing the same are provided. The method includes: implanting conductive metal ions into a substrate including quartz to form a conductive layer inside the quartz substrate; coating a resist on the quartz substrate in which the conductive layer is formed, to form a resist coating layer; exposing the resist coating layer to an electron beam to form micropatterns; etching the quartz substrate by using the resist coating layer, in which the micropatterns are formed, as a mask; and removing the resist coating layer to obtain a master in which micropatterns are formed.

20 Claims, 15 Drawing Sheets

APPARATUS COMPRISING SUBSTRATE AND CONDUCTIVE LAYER

CROSS-REFERENCE TO RELATED PATENT APPLICATIONS

This application is a continuation of application Ser. No. 13/113,534, filed May 23, 2011, now U.S. Pat. No. 8,349,527, which is a divisional of application Ser. No. 11/745,609, filed May 8, 2007, now U.S. Pat. No. 7,968,253, which claims priority from Korean Patent Application Nos. 10-2006-0055538, filed on Jun. 20, 2006 and 10-2006-0125657, filed on Dec. 11, 2006, respectively, in the Korean Intellectual Property Office.

BACKGROUND OF THE INVENTION

1. Field of the Invention

Apparatuses and methods consistent with the present invention relate to a nano imprint master and manufacturing the same, and more particularly, to a method of manufacturing a nano imprint master by which time and costs required for manufacturing the nano imprint master can be reduced without the need for performing a process of removing a metal conductive layer, and a nano imprint master manufactured using the method.

2. Description of the Related Art

Enormous information is pouring as the modern age is called an information-oriented age. Thus, a study for a high dense recording medium for recording enormous information has been briskly proceeded.

Methods of patterning micropatterns of a mask or master on a high dense recording medium include a photolithography technology and a nano imprint lithography technology.

In a photolithography technology, there are problems, such as astronomical costs of equipment, complexity of a device, and difficulty of installation and maintenance, and it is difficult to reproduce in large quantities micropatterns equal to or smaller than 50 nm by one shot. Contrary to this, according to a nano imprint lithography technology, micropatterns can be easily and simply formed and recording media can be reproduced in large quantities with low costs. Thus, the nano imprint lithography technology is usually used in generating micropatterns of a recording medium.

Micropatterns reproduced by nano imprinting are patterns in which patterns of a nano imprint master are transferred without changes. How to produce the nano imprint master very elaborately and easily is most important in the nano imprint lithography technology.

FIGS. 1A-1C illustrate a related art nano imprint process. As illustrated in FIGS. 1A-1C, when a nano imprint process is performed using a nano imprint master 20, firstly, the nano imprint master 20 is disposed on a substrate 10 as shown in FIG. 1A. Next, when ultraviolet (UV) light is irradiated, a polymer resin formed on the substrate 10 is molten, and micropatterns of the nano imprint master 20 are transferred as shown in FIG. 1B. Next, if the substrate 10 is ashed after the nano imprint master 20 is removed from the substrate 10, a recording medium in which micropatterns are formed on the substrate 10 can be obtained as shown in FIG. 1C.

In this case, transparent quartz or glass is used in forming a master substrate used in nano imprinting. This is because UV light must be delivered to and transmitted through both a portion in which patterns of the nano imprint master are formed and a portion in which the patterns of the nano imprint master are not formed so that the polymer resin can be cured.

If there is an opaque portion in part of a region of the nano imprint master, UV light cannot be transmitted through the opaque portion and polymer remains in a corresponding portion in a flowing state. If the nano imprint master is separated from the polymer resin in this state, an uncured polymer resin sticks to the nano imprint master and is detached from a cured polymer resin together with the nano imprint master so that the nano imprint process cannot be properly performed. Thus, since the nano imprint master must be maintained overall in a transparent state, a quartz substrate is commonly used in the nano imprint process.

FIG. 2 is a flowchart illustrating a related art method of manufacturing a nano imprint master. Hereinafter, a method of manufacturing a nano imprint master having micropatterns will be described with reference to FIG. 2.

Firstly, a master substrate is prepared in operation S20. Next, chromium is deposited on a top surface of the master substrate through sputtering in operation S21. Subsequently, an electron beam resist is applied onto the chromium layer in operation S22, and the electron beam resist is patterned using an electron beam exposure device in operation S23.

Subsequently, after the chromium layer is dry etched using the resist coating layer in which micropatterns are formed, as a mask in operation S24, the master substrate is dry etched so that the micropatterns formed in the chromium layer can be transferred to the master substrate in operation S25.

Last, the resist coating layer is stripped or ashed in operation S26, and the chromium layer is completely removed through wet etching and then is cleaned in operation S27, thereby obtaining a nano imprint master in operation S28.

The chromium metal layer is deposited on the master substrate in operation S21, so as to remove electric charges occurring when electron beams are irradiated to the master substrate and the resist formed of dielectric materials, respectively, in the operation of forming patterns using electron beams.

That is, if electric charges are generated in the master substrate and the resist, polarization, in which one surface of the master substrate and an opposed surface thereof have different polarities, occurs. This polarization may cause distortion of micropatterns formed in the mater substrate. In order to prevent polarization, the electric charges are grounded to the outside along the surface of the chromium metal layer and are removed.

According to the above-described related art method of manufacturing a nano imprint master, the chromium metal layer is deposited on the master substrate and then must be etched in a subsequent process and after the master substrate is patterned, the chromium metal layer must be removed. In this way, the method is complicated so that enormous time and costs are required for manufacturing the nano imprint master.

In addition, since the nano imprint master is formed of hardened quartz or glass, when the surface of a substrate on which patterns are imprinted is curved, contact between the nano imprint master and the substrate is nonuniform so that nano imprinting is not uniformly performed and damages may occur in the master used in nano imprinting.

SUMMARY OF THE INVENTION

The present invention provides a method of manufacturing a nano imprint master by which time and costs required for manufacturing the nano imprint master can be reduced without the need for performing a process of removing a metal conductive layer, and a nano imprint master manufactured using the method.

The present invention also provides a method of manufacturing a nano imprint master by which a polymer layer acting as a buffer layer during nano imprinting is introduced and nano imprinting can be uniformly performed on a large scale, and a nano imprint master manufactured using the method.

According to an aspect of the present invention, there are provided a method of manufacturing a nano imprint master, the method comprising: implanting conductive metal ions into a quartz substrate to form a conductive layer inside the quartz substrate; coating a resist on the quartz substrate in which the conductive layer is formed, to form a resist coating layer; exposing the resist coating layer to an electron beam to form micropatterns; etching the quartz substrate by using the resist coating layer, in which the micropatterns are formed, as a mask; and removing the resist coating layer to obtain a master in which micropatterns are formed, and a nano imprint master manufactured by the method.

According to another aspect of the present invention, there are provided a method of manufacturing a nano imprint master, the method comprising: epitaxially growing or depositing silicon oxide or silicon nitride on a quartz substrate to form a silicon oxide layer or a silicon nitride layer; implanting conductive metal ions into the silicon oxide layer or the silicon nitride layer to form a conductive layer inside the silicon oxide layer or the silicon nitride layer; coating a resist on the silicon oxide layer or the silicon nitride layer to form a resist coating layer; exposing the resist coating layer to an electron beam to form micropatterns; etching the quartz substrate in which the silicon oxide layer or the silicon nitride layer is formed, by using the resist coating layer, in which the micropatterns are formed, as a mask; and removing the resist coating layer to obtain a master in which micropatterns are formed, and a nano imprint master manufactured by the method.

According to another aspect of the present invention, there are provided a method of manufacturing a nano imprint master, the method comprising: depositing a conductive metal on a quartz substrate to form a conductive layer; epitaxially growing or depositing silicon oxide or silicon nitride on the conductive layer to form a silicon oxide layer or a silicon nitride layer; coating a resist on the silicon oxide layer or the silicon nitride layer to form a resist coating layer; exposing the resist coating layer to an electron beam to form micropatterns; and etching the quartz substrate in which the silicon oxide layer or the silicon nitride layer is formed, by using the resist coating layer in which the micropatterns are formed, and a nano imprint master manufactured by the method.

According to another aspect of the present invention, there are provided a method of manufacturing a nano imprint master, the method comprising: forming a polymer layer on a substrate; implanting conductive metal ions into the polymer layer to form a conductive layer inside the polymer layer; coating a resist on the polymer layer in which the conductive layer is formed, to form a resist coating layer; exposing the resist coating layer to an electron beam to form micropatterns; etching the polymer layer by using the resist coating layer, in which the micropatterns are formed, as a mask; and removing the resist coating layer to obtain a master in which micropatterns are formed on the polymer layer, and a nano imprint master manufactured by the method.

According to another aspect of the present invention, there are provided a method of manufacturing a nano imprint master, the method comprising: forming a polymer layer on a substrate; forming a silicon oxide layer or a silicon nitride layer on the polymer layer; implanting conductive metal ions into the silicon oxide layer or the silicon nitride layer to form a conductive layer inside the silicon oxide layer or the silicon nitride layer; coating a resist on the polymer layer in which the conductive layer is formed, to form a resist coating layer; exposing the resist coating layer to an electron beam to form micropatterns; etching the silicon oxide layer or the silicon nitride layer by using the resist coating layer, in which the micropatterns are formed, as a mask; and removing the resist coating layer to obtain a master in which micropatterns are firmed on the polymer layer, and a nano imprint master manufactured by the method.

According to another aspect of the present invention, there are provided a method of manufacturing a nano imprint master, the method comprising: forming a polymer layer on a substrate; depositing a conductive metal on the polymer layer to form a conductive layer; forming a silicon oxide layer or a silicon oxide layer on the conductive layer; coating a resist on the silicon oxide layer or the silicon nitride layer to form a resist coating layer; exposing the resist coating layer to an electron beam to form micropatterns; etching the silicon oxide layer or the silicon nitride layer by using the resist coating layer, in which the micropatterns are formed, as a mask; and removing the resist coating layer to obtain a master in which micropatterns are formed in the silicon oxide layer or the silicon nitride layer, and a nano imprint master manufactured by the method.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF EXEMPLARY EMBODIMENTS

The present invention will now be described more fully with reference to the accompanying drawings, in which exemplary embodiments of the invention are shown.

FIGS. 3A-3F illustrate a method of manufacturing a nano imprint master according to an exemplary embodiment of the present invention.

Figure 3A:
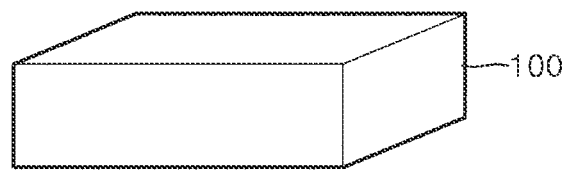
FIGS. 3A-3F illustrate a method of manufacturing a nano imprint master according to an exemplary embodiment of the present invention.

Firstly, a quartz substrate 100 is prepared as shown in FIG. 3A.

Figure 3B:
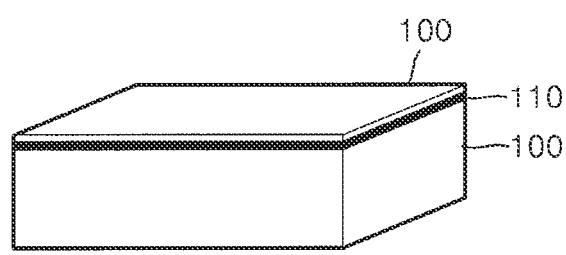

Conductive metal ions are implanted into a top surface of the quartz substrate 100, thereby forming a conductive layer 110 inside the quartz substrate 100 as shown in FIG. 3B. In this case, the conductive layer 110 may be formed by implanting chromium ions, titanium ions, silver ions, gold ions, aluminum ions or platinum ions into the quartz substrate 100.

In ion implantation, a material to be doped is ionized and accelerated to increase a kinetic energy and the ionized material is forcibly injected into the surface of the quartz substrate 100 so that high-purity impurity implantation is possible and the uniformity of a doping concentration can be maintained.

This ion implantation is usefully applied to the case where ions are implanted to a comparatively shallow depth. When the conductive metal ions are implanted into the quartz substrate 100, the conductive layer 110 is formed to be close to the surface of the quartz substrate 100, as illustrated in FIG. 3B.

When the conductive layer 110 is formed inside the quartz substrate 100 in this way, electric charges that occur during electron beam lithography are grounded and can be effectively removed so that distortion of micropatterns due to the occurrence of electric charges can be prevented.

It is important to reduce the thickness of the conductive layer 110 when the conductive layer 110 is formed. This is because, when the thickness of the conductive layer 110 is very large, UV light transmittance is lowered, as described above, so that a polymer resin sticks to the nano imprint master during a nano imprint process and the nano imprint process cannot be successfully performed.

The thickness of the conductive layer 110 at which the nano imprint process can be successfully performed will now be described with reference to FIGS. 4A-4C and 5.

Figure 4A:
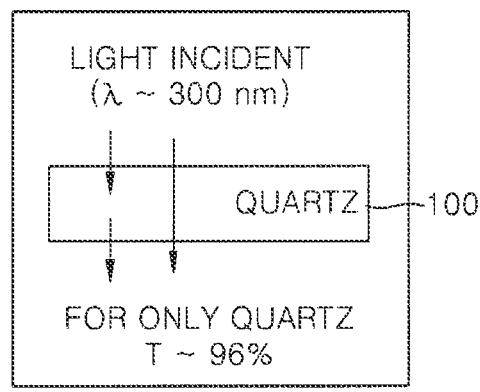
FIGS. 4A-4C illustrate light transmittance when ultraviolet (UV) light is irradiated onto a quartz substrate according to an exemplary embodiment of the present invention.
Figure 4B:
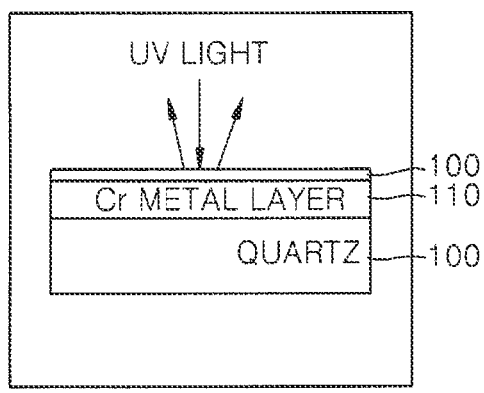
Figure 4C:
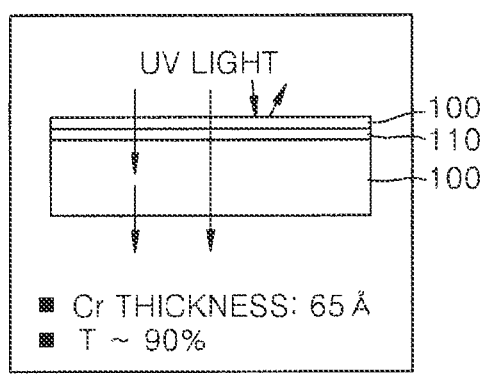

FIGS. 4A-4C illustrate light transmittance when UV light is irradiated onto the quartz substrate 100. When light transmittance of the pure quartz substrate 100 is about 96%, as illustrated in FIG. 4A and when a thick conductive layer 110 is formed inside the quartz substrate 100, as illustrated in FIG. 4B, light transmittance is rapidly lowered and reflectivity is increased. When a thin conductive layer 110 is formed inside the quartz substrate 100 to a thickness of 65 Å, as illustrated in FIG. 4C, light transmittance is about 90%. The relationship between light transmittance and the thickness of the conductive layer will now be described with reference to FIG. 5.

Figure 5:
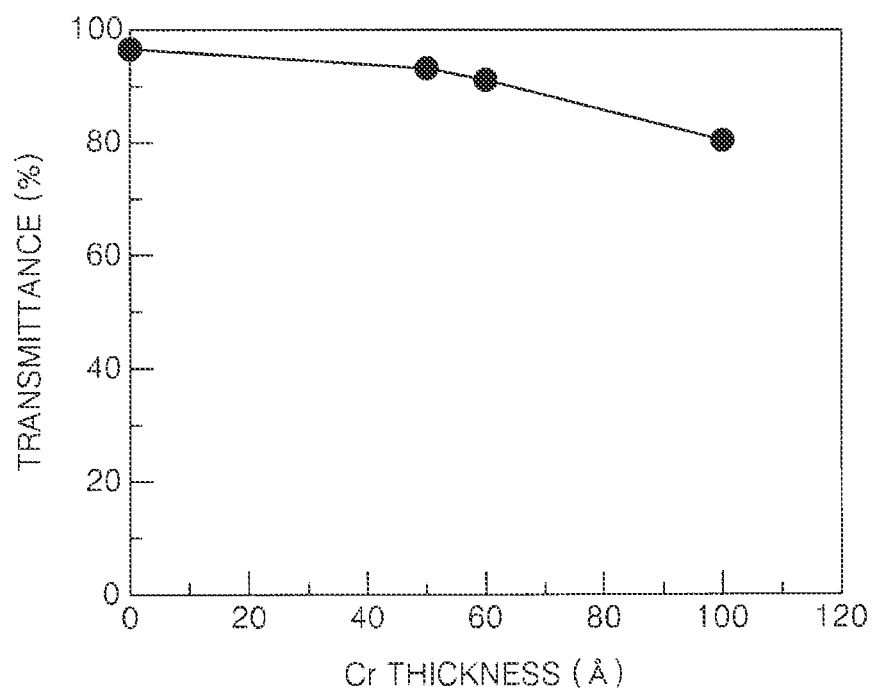
FIG. 5 is a graph showing a change of light transmittance according to the thickness of a conductive layer when the conductive layer is formed inside a nano imprint master according to an exemplary embodiment of the present invention.

FIG. 5 is a graph showing a change of light transmittance according to the thickness of a conductive layer when the conductive layer is formed inside a nano imprint master according to an exemplary embodiment of the present invention.

In FIG. 5, the horizontal axis represents the thickness of a chromium conductive layer and the vertical axis represents light transmittance of a quartz substrate. UV light having a wavelength of 300 μm was used in this experiment considering that UV light is generally used in a nano imprint process.

Referring to FIG. 5, as the thickness of the chromium layer is increased to 0, 50, 60, and 100, respectively, light transmittance is lowered to 96, 93, 91, and 80, respectively.

Here, light transmittance must be maintained to be at least 80% or higher so that the quartz substrate 100 can be used as the nano imprint master. This light transmittance is achieved by forming a conductive layer to a thickness of less than a skin depth.

The skin depth can be calculated by equation (1) as below and is an eigen value according to metal.

$$\delta = \frac{1}{|k|} = \sqrt{\frac{2}{\omega\mu\sigma}} \qquad (1)$$

where, k is a propagation constant, ω (=2πf) is an angular frequency, μ is magnetic permeability (4π×10$^{-7}$), and σ is electrical conductivity. Thus, if metal ions to be implanted are specified in a specific frequency (or wavelength), the skin depth with respect to corresponding metal is determined, and if metal ions are implanted so that a conductive layer can be formed to a thickness of less than the determined skin depth, a nano imprint master having good UV light transmittance can be manufactured.

Subsequently, the method of manufacturing a nano imprint master will now be described with reference to FIGS. 3A-3F.

Figure 3C:
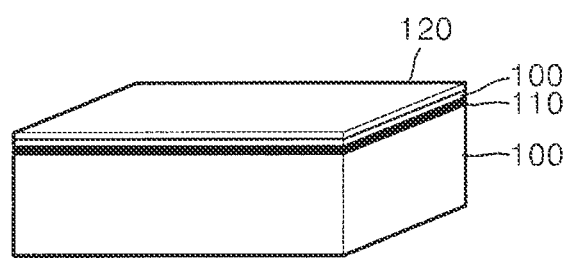

After the conductive layer 110 is formed inside the quartz substrate 100, the substrate 100 is coated with an electron beam resist, thereby forming a resist layer 120 as shown in FIG. 3C.

Figure 3D:
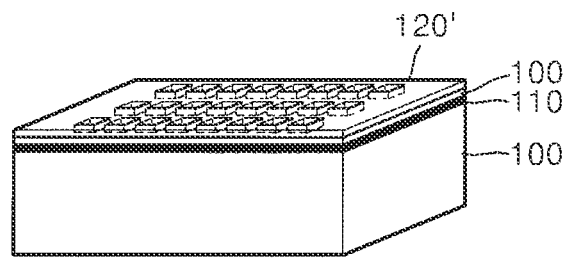
Figure 3E:
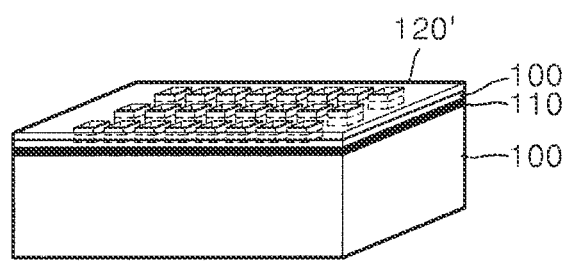

Next, after micropatterns are formed in the resist layer 120 using an electron beam exposure device as shown in FIG. 3D. The quartz substrate 100 is etched using the resist 120', in which the micropatterns are formed, as a mask so that the micropatterns of the resist 120' are transferred to the quartz substrate 100 as shown in FIG. 3E. In this case, the quartz substrate 100 may be etched by dry etching.

Figure 3F:
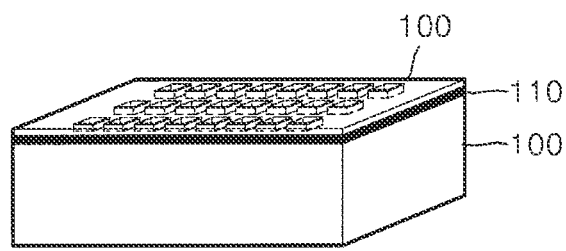

Last, when the resist 120' in which the micropatterns are formed, is removed by stripping or ashing, a nano imprint master in which micropatterns are formed can be obtained as shown in FIG. 3F.

When the nano imprint master is manufactured using the above-described method, the metal conductive layer 110 is formed inside the quartz substrate 100 and does not need to be removed separately. Thus, the number of processes of manufacturing a nano imprint master can be reduced and time and costs required for manufacturing the nano imprint master can be greatly reduced.

Since it is not easy to implant conductive metal ions into a solid quartz substrate as illustrated in FIGS. 3A-3F, an oxide layer is deposited or grown on the quartz substrate and then the conductive metal ions are implanted into the oxide layer so that the conductive layer can be formed more easily, which will be described with reference to FIGS. 6A-6C and 7A-7C.

FIGS. 6A-6C and FIGS. 7A-7C illustrate methods of manufacturing a quartz substrate used in manufacturing a nano imprint master according to other exemplary embodiments of the present invention.

Figure 6A:
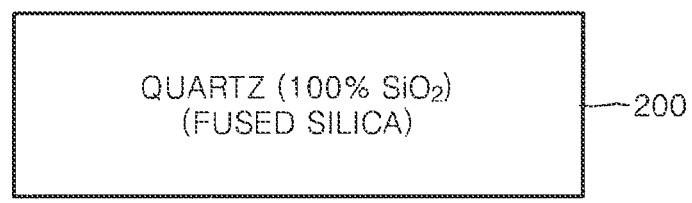
FIGS. 6A-6C illustrate a method of manufacturing a quartz substrate used in manufacturing a nano imprint master according to an exemplary embodiment of the present invention.
Figure 6B:
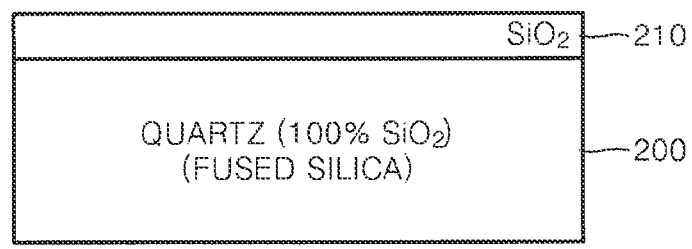
Figure 6C:
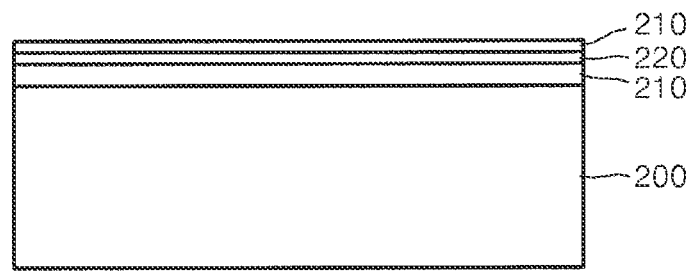

Referring to FIGS. 6A-6C, after the quartz substrate 200 is prepared as shown in FIG. 6A, silicon oxide ($SiO_2$) is deposited or epitaxially grown on a top surface of the quartz substrate 200, thereby forming a silicon oxide layer 210 as shown in FIG. 61B, and thereafter, conductive metal ions are implanted into the silicon oxide layer 210, thereby forming a conductive layer 220 as shown in FIG. 6C.

Figure 7A:
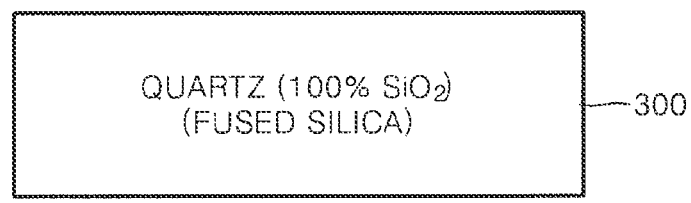
FIGS. 7A-7C illustrate a method of manufacturing a quartz substrate used in manufacturing a nano imprint master according to another exemplary embodiment of the present invention.
Figure 7B:
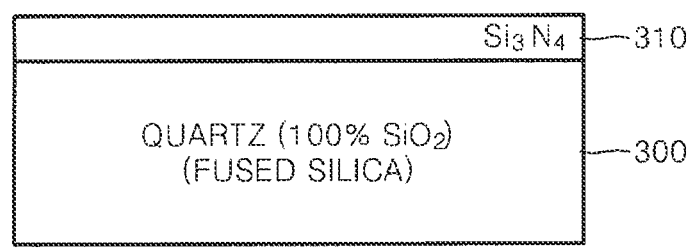
Figure 7C:
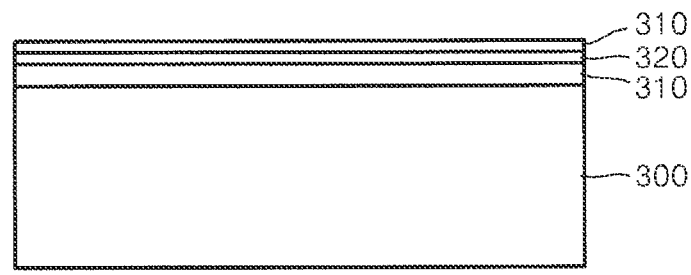

Referring to FIGS. 7A-7C, silicon nitride ($Si_3N_4$) is deposited or epitaxially grown on a quartz substrate 300, thereby forming a silicon nitride layer 310 as shown in FIGS. 7A-7B, and then, conductive metal ions are implanted into the silicon nitride layer 310 by ion implantation, thereby forming a conductive layer 320 as shown in FIG. 7C.

The operation of applying a resist and forming micropatterns after forming the silicon oxide layer 210 or the silicon nitride layer 310 is the same as that of FIGS. 3A-3F. The thicknesses of the conductive layers 220 and 320 must also be maintained to be less than a skin depth in consideration of light transmittance. As compared with FIGS. 3A-3F, there is only a difference in that micropatterns are not formed in the quartz substrates 200 and 300 but are formed in oxide layers 210 and 310 or in both the oxide layers 210 and 310 and the conductive layers 220 and 320.

FIGS. 8A-8D illustrate methods of manufacturing a quartz substrate used in manufacturing a nano imprint master according to other exemplary embodiments of the present invention.

Figure 8A:
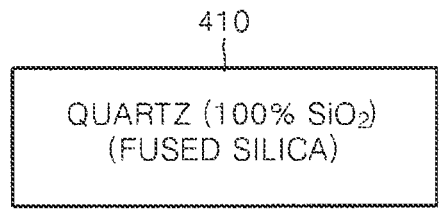
FIGS. 8A-8D illustrate methods of manufacturing a quartz substrate used in manufacturing a nano imprint master according to other exemplary embodiments of the present invention.
Figure 8B:
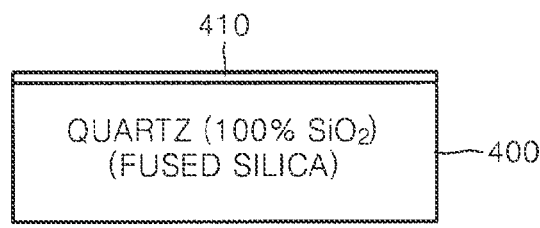

Referring to FIGS. 8A-8D, after the quartz substrate 400 is prepared (FIG. 5A), a conductive metal is deposited on a quartz substrate 400 through sputtering, thereby forming a conductive layer 410 (FIG. 8B). Even in this case, the thickness of the conductive layer 410 must be less than a skin depth in consideration of light transmittance.

The conductive layer 410 may be one of a chromium layer, a titanium layer, a silver layer, a gold layer, an aluminum layer, and a platinum layer.

Figure 8C:
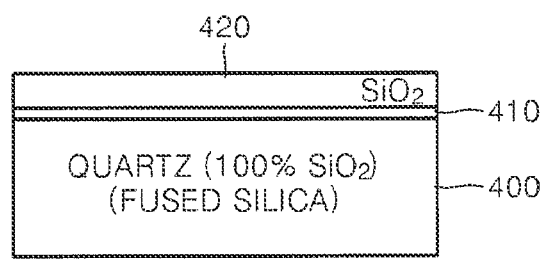
Figure 8D:
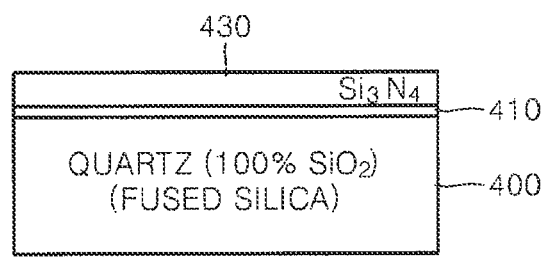

Next, silicon oxide ($SiO_2$) or silicon nitride ($Si_3N_4$) may be epitaxially grown or deposited on the conductive layer, thereby forming a silicon oxide layer 420 or a silicon nitride layer 430, as respectively shown in FIG. 8C and FIG. 8D.

The operation of applying a resist and forming micropatterns after the silicon oxide ($SiO_2$) layer 420 or the silicon nitride ($Si_3N_4$) layer 430 is the same as that of FIGS. 3A-3F. There is only a difference between FIGS. 3A-3F and FIGS. 8A-8D in that micropatterns are not formed in the quartz substrate 400 but are formed in the silicon oxide layer 420 or the silicon nitride layer 430.

In the method of manufacturing a nano imprint master according to the exemplary embodiment of the present invention, the processes of removing a metal conductive layer and cleaning the surface of a quartz substrate after removing the metal conductive layer can be reduced so that the method of manufacturing a nano imprint master can be simplified.

FIGS. 9A-9F illustrate a method of manufacturing a quartz substrate used in manufacturing a nano imprint master according to another exemplary embodiment of the present invention.

Figure 9A:
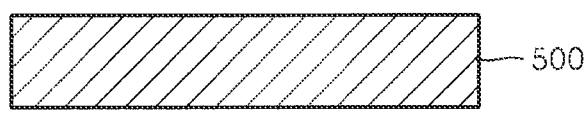
FIGS. 9A-9F illustrate a method of manufacturing a quartz substrate used in manufacturing a nano imprint master according to another exemplary embodiment of the present invention.

Firstly, a master substrate 500 is prepared as shown in FIG. 9A. In this case, a material for the master substrate 500 may be quartz.

Figure 9B:
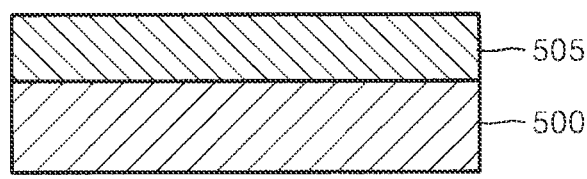

A polymer layer 505 is formed on a top surface of the master substrate 500 as shown in FIG. 9B. In this case, the polymer layer 505 may be formed of high elastic polymer such as polydimethylsiloxane (PDMS) and may be coated through spin coating or chemical vapor deposition (CVD). Uneven patterns are formed on the polymer layer 505 through a subsequent process, and the polymer layer 505 acts as a buffer layer during imprinting so that nano imprinting can be uniformly performed on a large scale.

Figure 9C:
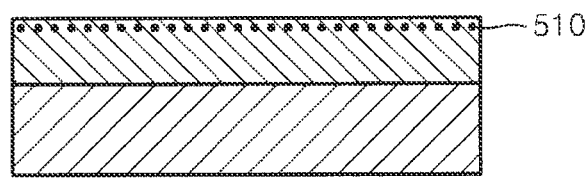

Next, conductive metal ions are implanted into the polymer layer 505, thereby forming a conductive layer 510 inside the polymer layer 505 as shown in FIG. 9C. In this case, the conductive layer 510 may be formed by implanting chromium ions, titanium ions, silver ions, gold ions, aluminum ions or platinum ions into the polymer layer 505

In ion implantation, a material to be doped is ionized and accelerated to increase a kinetic energy and the ionized material is forcibly injected into the surface of the polymer layer 505 so that high-purity impurity implantation is possible and the uniformity of a doping concentration can be maintained.

This ion implantation is usefully applied to the case where ions are implanted to a comparatively shallow depth. When the conductive metal ions are implanted into the polymer layer 505, the conductive layer 510 is formed to be close to the surface of the polymer layer 505, as illustrated in FIG. 9C.

When the conductive layer 510 is formed inside the polymer layer 505 in this way, electric charges that occur during electron beam lithography are grounded and can be effectively removed so that distortion of micropatterns due to the occurrence of electric charges can be prevented.

It is important to reduce the thickness of the conductive layer 510 when the conductive layer 510 is formed. This is because, when the thickness of the conductive layer 510 is very large, UV light transmittance is lowered as described above so that a polymer resin is stuck to the nano imprint master during a nano imprint process and the nano imprint process cannot be successfully performed.

Transmittance of the nano imprint master with respect to UV light must be maintained to be at least 80% or higher. This light transmittance is achieved by forming the conductive layer 510 to a thickness of less than a skin depth. The skin depth can be calculated by the above-described equation (1).

Figure 9D:
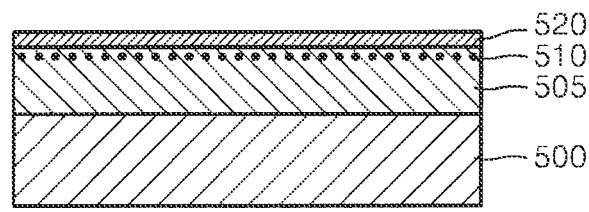

After the conductive layer 510 is formed inside the polymer layer 505, an electron beam resist is coated, thereby forming a resist layer 520 as shown in FIG. 9D.

Figure 9E:
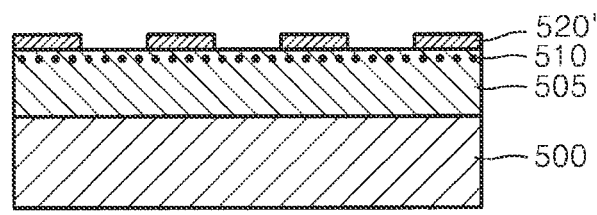

Next, after micropatterns are formed in the resist layer 520 using an electron beam exposure device as shown in FIG. 9E, the polymer layer 505 is etched using the resist 520', in which the micropatterns are formed, as a mask so that the micropatterns of the resist 520' are transferred to the polymer layer 505. In this case, the polymer layer 505 may be etched by dry etching.

Figure 1A:
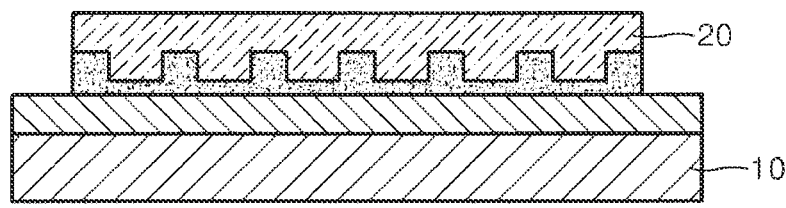
FIGS. 1A-1C illustrate a related art nano imprint process.
Figure 1B:
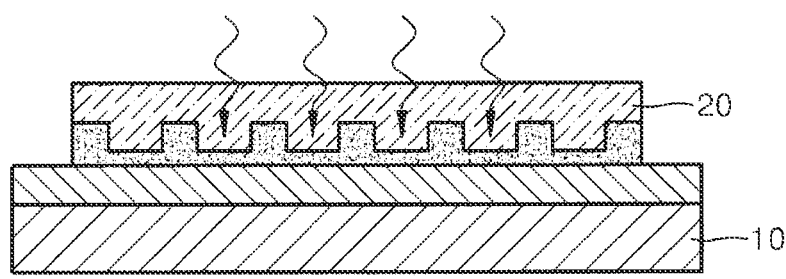
Figure 1C:
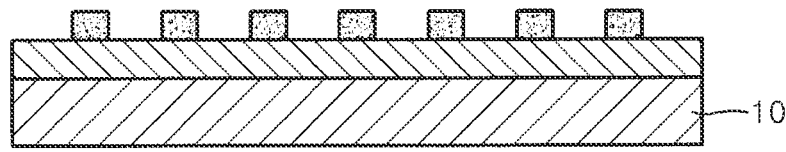
Figure 2:
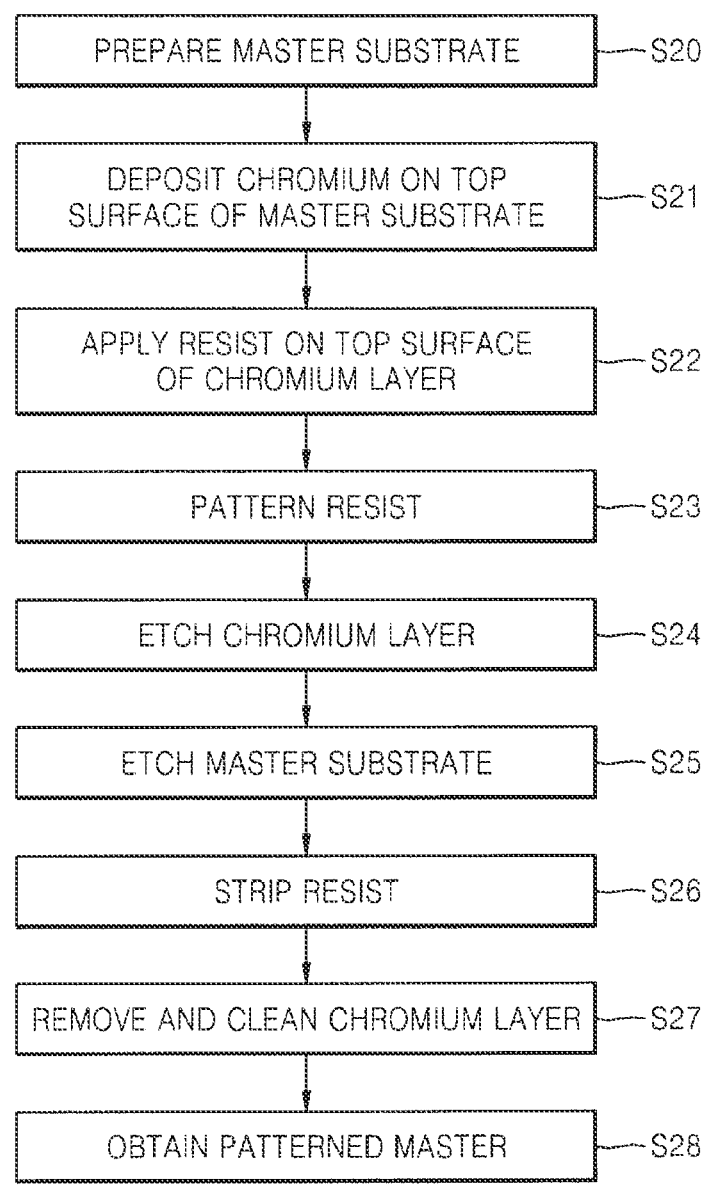
FIG. 2 is a flowchart illustrating a related art method of manufacturing a nano imprint master.
Figure 9F:
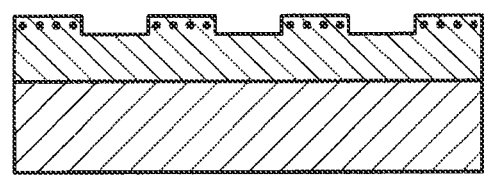

Last, when the resist 520' in which the micropatterns are formed, is removed by stripping or ashing, a nano imprint master having the polymer layer 505 in which the micropatterns are formed can be obtained as shown in FIG. 9F. Although not shown, an anti-sticking layer may also be formed on the polymer layer 505 in which the micropatterns are formed. The anti-sticking layer prevents the master (see 20 of FIG. 1A) and the imprinted substrate (see 10 of FIG. 1A) from sticking to each other for easy separation from each other during a nano imprint process. The anti-sticking layer may also be formed by depositing Teflon through CVD or by spin coating a self-assembly monolayer (SAM).

When manufacturing the nano imprint master using the above-described method, a uniform nano imprint master can be manufactured on a large scale during nano imprinting by introducing the polymer layer 505 acting as a buffer layer. In addition, the metal conductive layer 510 is formed inside the polymer layer 505 and does not need to be removed separately so that the number of processes of manufacturing a nano imprint master can be reduced and time and costs required for manufacturing the nano imprint master can be greatly reduced.

FIGS. 10A-10G illustrate a method of manufacturing a quartz substrate used in manufacturing a nano imprint master according to another exemplary embodiment of the present invention.

Figure 10A:
FIGS. 10A-10G illustrate a method of manufacturing a quartz substrate used in manufacturing a nano imprint master according to another exemplary embodiment of the present invention.
Figure 10B:
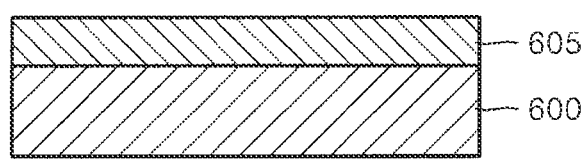
Figure 10C:
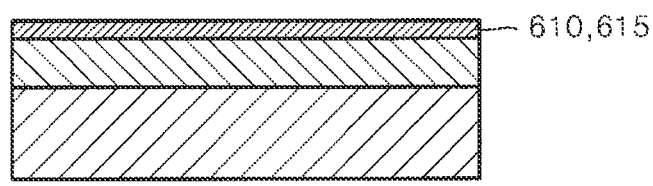
Figure 10D:
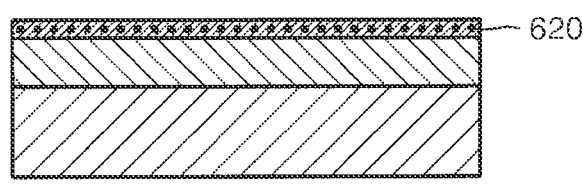

Referring to FIGS. 10A-10G, firstly, a master substrate 600 is prepared as shown in FIG. 10A. A polymer layer 605 is formed on a top surface of the substrate 600 as shown in FIG. 10B. Silicon oxide ($SiO_2$) or silicon nitride ($Si_3N_4$) is deposited or epitaxially grown on a top surface of the polymer layer 605, thereby forming a silicon oxide layer 610 or a silicon nitride layer 615 as shown in FIG. 10C. Subsequently, conductive metal ions are implanted into the silicon oxide layer 610 by ion implantation, thereby forming a conductive layer 620 as shown in FIG. 10D. The thickness of the conductive layer 620 is maintained to be less than a skin depth in consideration of light transmittance.

Figure 10E:
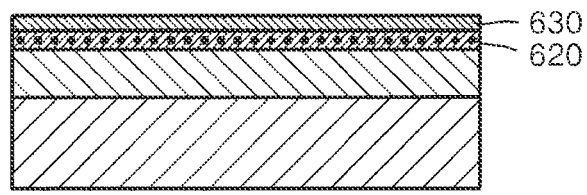
Figure 10F:
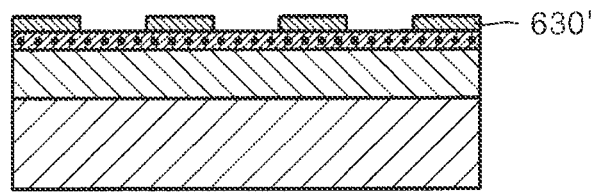
Figure 10G:
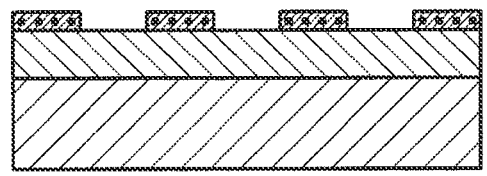

Subsequent operations are similar to those of FIGS. 9A-9F. There is only a difference between FIGS. 9A-9F and FIGS. 10A-10G in that micropatterns are not formed in the polymer layer 605 but are formed in the silicon oxide layer 610 or the silicon nitride layer 615. Specifically, a resist layer 630 is formed by coating an electron beam resist as shown in FIG. 10E, micropatterns are formed in the resist layer 630 using an electron beam exposure device as shown in FIG. 10F, and then, the silicon oxide layer 610 or the silicon nitride layer 615 is etched using the resist 630', in which the micropatterns are formed, as a mask so that the micropatterns of the resist 630' are transferred to the silicon oxide layer 610 or the silicon nitride layer 615. Next, the resist 630' in which micropatterns are formed, is removed by stripping or ashing and thus, a nano imprint master in which the micropatterns are formed can be obtained as shown in FIG. 10G. Although not shown, an anti-sticking layer may also be formed on the silicon oxide layer 610 or the silicon nitride layer 615.

FIGS. 11A-11G illustrate a method of manufacturing a quartz substrate used in manufacturing a nano imprint master according to another exemplary embodiment of the present invention.

Figure 11A:
FIGS. 11A-11G illustrate a method of manufacturing a quartz substrate used in manufacturing a nano imprint master according to another exemplary embodiment of the present invention.
Figure 11B:
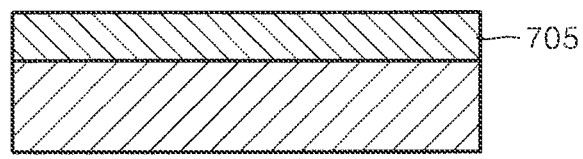
Figure 11C:
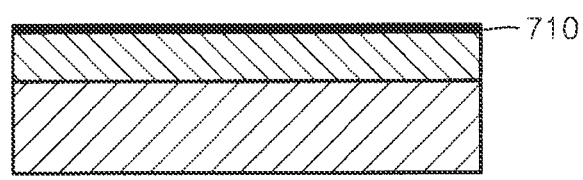

Referring to FIGS. 11A-11G firstly, a master substrate 700 is prepared as shown in FIG. 11A. A polymer layer 705 is formed on the substrate 700 as shown in FIG. 11B. A conductive layer 710 is formed on the polymer layer 705 by depositing a conductive metal on the polymer layer 705 through sputtering as shown in FIG. 11C. Even in this case, the thickness of the conductive layer 710 is maintained to be less than a skin depth in consideration of light transmittance.

The conductive metal used in forming the conductive layer 710 may be one of chromium, titanium, silver, gold, aluminum, and platinum.

Figure 11D:
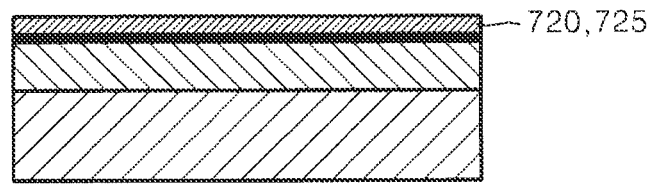

Next, silicon oxide ($SiO_2$) or silicon nitride ($Si_3N_4$) is epitaxially grown or deposited on the conductive layer 710, thereby forming a silicon oxide layer 720 or a silicon nitride layer 725 as shown in FIG. 11D.

Figure 11E:
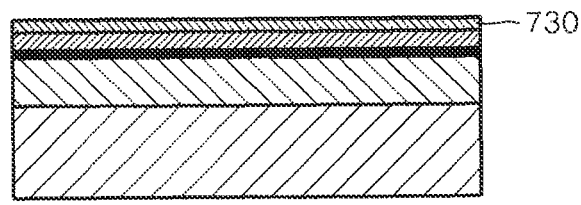
Figure 11F:
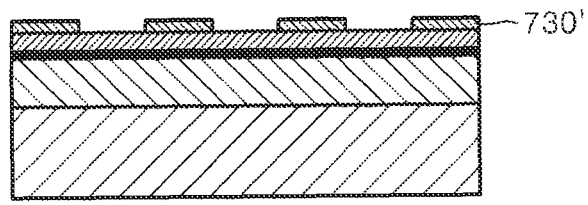
Figure 11G:
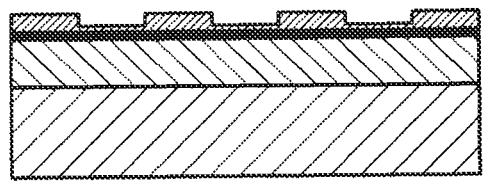

Subsequent operations are similar to those of FIGS. 9A-9F. There is only a difference between FIGS. 9A-9F and FIGS. 11A-11G in that micropatterns are not formed in the polymer layer 705 but are formed in the silicon oxide layer 720 or the silicon nitride layer 725. Specifically, a resist layer 730 is formed by coating an electron beam resist as shown in FIG. 11E, micropatterns are formed in the resist layer 730 using an electron beam exposure device as shown in FIG. 11F, and then, the silicon oxide layer 720 or the silicon nitride layer 725 is etched using the resist 730', in which the micropatterns are formed, as a mask so that the micropatterns of the resist 730' are transferred to the silicon oxide layer 720 or the silicon nitride layer 725. Next, the resist 730' in which micropatterns are formed, is removed by stripping or ashing and thus, a nano imprint master in which the micropatterns are formed can be obtained as shown in FIG. 11G. Although not shown, an anti-sticking layer may also be formed on the silicon oxide layer 720 or the silicon nitride layer 725.

According to an exemplary embodiment of the present invention, a process of removing a metal conductive layer does not need to be performed when a nano imprint master is manufactured so that time and costs required for manufacturing the nano imprint master can be greatly reduced.

In addition, a polymer layer acting as a buffer layer during nano imprinting is introduced so that nano imprinting can be uniformly performed on a large scale.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. An apparatus comprising:
   a light-transmitting substrate;
   a silicon oxide or silicon nitride layer comprising micropatterns, formed on the substrate; and
   a conductive layer implanted in the silicon oxide or silicon nitride layer.

2. The apparatus of claim 1, wherein the substrate comprises quartz or fused silica.

3. The apparatus of claim 1, wherein a light transmittance of the conductive layer is 80% or greater.

4. The apparatus of claim 1, wherein the conductive layer comprises a chromium layer, a titanium layer, a silver layer, a gold layer, an aluminum layer, or a platinum layer.

5. An apparatus comprising:
   a light-transmitting substrate;
   a silicon oxide or silicon nitride layer comprising micropatterns, formed on the substrate; and
   a conductive layer formed between the substrate and the silicon oxide or silicon nitride layer.

6. The apparatus of claim 5, wherein the substrate comprises quartz or fused silica.

7. The apparatus of claim 5, wherein a light transmittance of the conductive layer is 80% or greater.

8. The apparatus of claim 5, wherein the conductive layer comprises a chromium layer, a titanium layer, a silver layer, a gold layer, an aluminum layer, or a platinum layer.

9. An apparatus comprising:
   a substrate;
   a polymer layer comprising micropatterns, formed on the substrate; and
   a conductive layer implanted in the polymer layer.

10. The apparatus of claim 9, wherein the substrate comprises quartz or fused silica.

11. The apparatus of claim 9, wherein a light transmittance of the conductive layer is 80% or greater.

12. The apparatus of claim 9, wherein the conductive layer comprises a chromium layer, a titanium layer, a silver layer, a gold layer, an aluminum layer, or a platinum layer.

13. An apparatus comprising:
   a substrate;
   a polymer layer formed on the substrate;
   a silicon oxide layer or a silicon nitride layer comprising micropatterns, formed on the polymer layer; and
   a conductive layer implanted in the silicon oxide or silicon nitride layer.

14. The apparatus of claim 13, wherein the substrate comprises quartz or fused silica.

15. The apparatus of claim 13, wherein a light transmittance of the conductive layer is 80% or greater.

16. The apparatus of claim 13, wherein the conductive layer comprises a chromium layer, a titanium layer, a silver layer, a gold layer, an aluminum layer, or a platinum layer.

17. An apparatus comprising:
a substrate;
a polymer layer formed on the substrate;
a conductive layer formed on the polymer layer, wherein the conductive layer transmits light; and
a silicon oxide layer or a silicon nitride layer comprising micropatterns, formed on the conductive layer.

18. The apparatus of claim 17, wherein the substrate comprises quartz or fused silica.

19. The apparatus of claim 17, wherein a light transmittance of the conductive layer is 80% or greater.

20. The apparatus of claim 17, wherein the conductive layer comprises a chromium layer, a titanium layer, a silver layer, a gold layer, an aluminum layer, or a platinum layer.

* * * * *